(12) United States Patent
Jacobsen et al.

(10) Patent No.: US 7,436,200 B1
(45) Date of Patent: Oct. 14, 2008

(54) APPARATUS FOR TESTING A POWER SUPPLY

(75) Inventors: Bill Jacobsen, Sunnyvale, CA (US); Zoltan Zansky, San Carlos, CA (US); Thomas Holland, Mountain View, CA (US)

(73) Assignee: Network Appliance, Inc., Sunnyvale, CA (US)

( * ) Notice: Subject to any disclaimer, the term of this patent is extended or adjusted under 35 U.S.C. 154(b) by 0 days.

(21) Appl. No.: 11/607,085

(22) Filed: Nov. 30, 2006

(51) Int. Cl.
*G01R 31/36* (2006.01)
*G01R 31/26* (2006.01)

(52) U.S. Cl. .................... 324/771; 324/769

(58) Field of Classification Search ............. 324/117 R, 324/771, 769
See application file for complete search history.

(56) References Cited

U.S. PATENT DOCUMENTS

| | | | | |
|---|---|---|---|---|
| 3,383,589 A | * | 5/1968 | Dugan, Jr. .................... | 324/618 |
| 4,037,156 A | * | 7/1977 | Goujon et al. ............... | 324/771 |
| 4,042,830 A | * | 8/1977 | Kellenbenz et al. ........... | 307/40 |
| 4,288,739 A | * | 9/1981 | Nercessian .................... | 323/275 |
| 4,357,574 A | * | 11/1982 | Takamisawa et al. ........ | 324/72.5 |
| 5,710,701 A | * | 1/1998 | Brown .......................... | 700/80 |
| 7,038,437 B2 | * | 5/2006 | Kenny et al. ................. | 323/283 |

* cited by examiner

*Primary Examiner*—Ha Nguyen
*Assistant Examiner*—Karen M Kusumakar
(74) *Attorney, Agent, or Firm*—Suiter Swantz pc llo

(57) ABSTRACT

The present invention is an apparatus for testing a power supply. A power supply testing apparatus may include a remote load which may sink an adjustable amount of current with an adjustable slew rate and may test the response of the power supply to determine its operability with a dynamic load. Additionally, in an alternative embodiment of the invention, the testing apparatus may source an adjustable amount of current with an adjustable slew rate to the output of a power supply. In yet another embodiment of the invention, the testing apparatus may include an adjustable current sink and adjustable current source with an adjustable slew rate. The power supply testing apparatus of the present invention may be implemented with standard circuit components on a circuit board and thus provide a small form factor. Additionally, due to the small form factor and low weight implementation, the power supply testing apparatus may utilize reduced length test wires which reduce the inductance in the test wires and increases the apparatus' slew rate for more effective testing.

25 Claims, 5 Drawing Sheets

APPARATUS FOR TESTING A POWER SUPPLY

FIELD OF THE INVENTION

The present invention generally relates to the field of power supplies, and more particularly to an apparatus and method for testing a power supply.

BACKGROUND OF THE INVENTION

Many electrical systems require a fixed and stable supply of electrical energy to operate optimally. One type of electrical system is a computing system. Computing systems typically include a motherboard which may refer to a main circuit board of a computing system. Typically, a motherboard may contain one or more modular or embedded power supplies for supplying power to the various components of a motherboard. Components of a motherboard may include a processor, BIOS, memory, interfaces and controllers which require power to operate.

In an application such as a computing system, a power supply may be a DC/DC power supply and may receive a twelve (12) volt input supply and provide a one (1) volt, three (3) volt or five (5) volt output supply to a power bus. Many components may receive power from the power bus, including active and passive switching devices which create a dynamic load. A dynamic load may be a device or set of devices coupled to the output of a power supply that draws varying current. A dynamic load may create load transients which may inject a disturbance into the power supply. The injection of a disturbance into the power supply may affect the power supply output which may negatively affect performance of components being supplied power through the power bus. For example, a processor is extremely sensitive to an unstable power supply and thus a disturbance will affect operation of the processor and the overall performance of a computing system employing the processor.

In order to ensure optimal performance of a computing system, load dynamics and steady-state performance of a power supply may be tested. However, it is difficult to adequately test the load dynamics and steady-state performance of a motherboard power supply. Conventional power supply testers include large form factor appliances comprising banks of electronic loads. Thus, conventional power supply testers are heavy and cumbersome. Due to their size and form factor, conventional power supply testers require a fixed placement on a work bench. As a result, long supply wires must be utilized to connect the power supply tester to the output terminals of a power supply under test. This reduces performance and quality of the test due to the substantial inductance of the supply wires which limits the external electronic load slew rate (di/dt). A slew rate may refer to a change in output current divided by a rise/fall time. Rise/fall time may refer to an amount of time required to transition between two values of current. Additionally, the load percentage rating and load dynamics (e.g. 0.5 to 50 A/usec) to a power supply module soldered into the motherboard or embedded into the motherboard (the power supply components are soldered into the motherboard) and loaded by circuits on the motherboard at what load currents and at what slew rate is not always known. Thus, a motherboard power supply must be tested while the power supply is soldered to or embedded into the motherboard. Consequently, an improved apparatus and method for testing a power supply is necessary.

SUMMARY OF THE INVENTION

Accordingly, the present invention is directed to an apparatus and method for testing a power supply. In an embodiment of the invention, a power supply testing apparatus may include a remote load which may sink an adjustable amount of current with an adjustable slew rate and may test the response of the power supply to determine its operability with a dynamic load. Additionally, in an alternative embodiment of the invention, the testing apparatus may source an adjustable amount of current with an adjustable slew rate to the output of a power supply to compensate what the circuits loading the power supply may load to the power supply. In yet another embodiment of the invention, the testing apparatus may include an adjustable current sink and adjustable current source with an adjustable slew rate. The power supply testing apparatus of the present invention may be implemented with transistors, resistors, diodes and capacitors on a circuit board and may be contained within a small form factor. Additionally, due to the small form factor and low weight implementation, the power supply testing apparatus may utilize reduced length supply wires of less than two inches which reduce the inductance in the supply wires to a value which assures the insertion of the load current into the power supply under test on a motherboard with adequately high slew rate for more effective testing.

It is to be understood that both the forgoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

Referring generally to FIGS. 1-5, exemplary embodiments of an apparatus and method for testing a power supply in accordance with the present invention are shown. The power supply testing apparatus of the present invention may be employed with conventional power supplies to determine the load dynamics and steady-state performance of the power supply. Advantageously, the testing apparatus of the present invention may be assembled in a low weight, small form factor implementation. The low weight, small form factor implementation may be placed in proximity with conventional power supplies, such as power supply modules soldered to a motherboard or embedded into the motherboard of a computing system, to allow short supply wires with reduced inductance than the long supply wires of conventional power supply testers.

Figure 1:
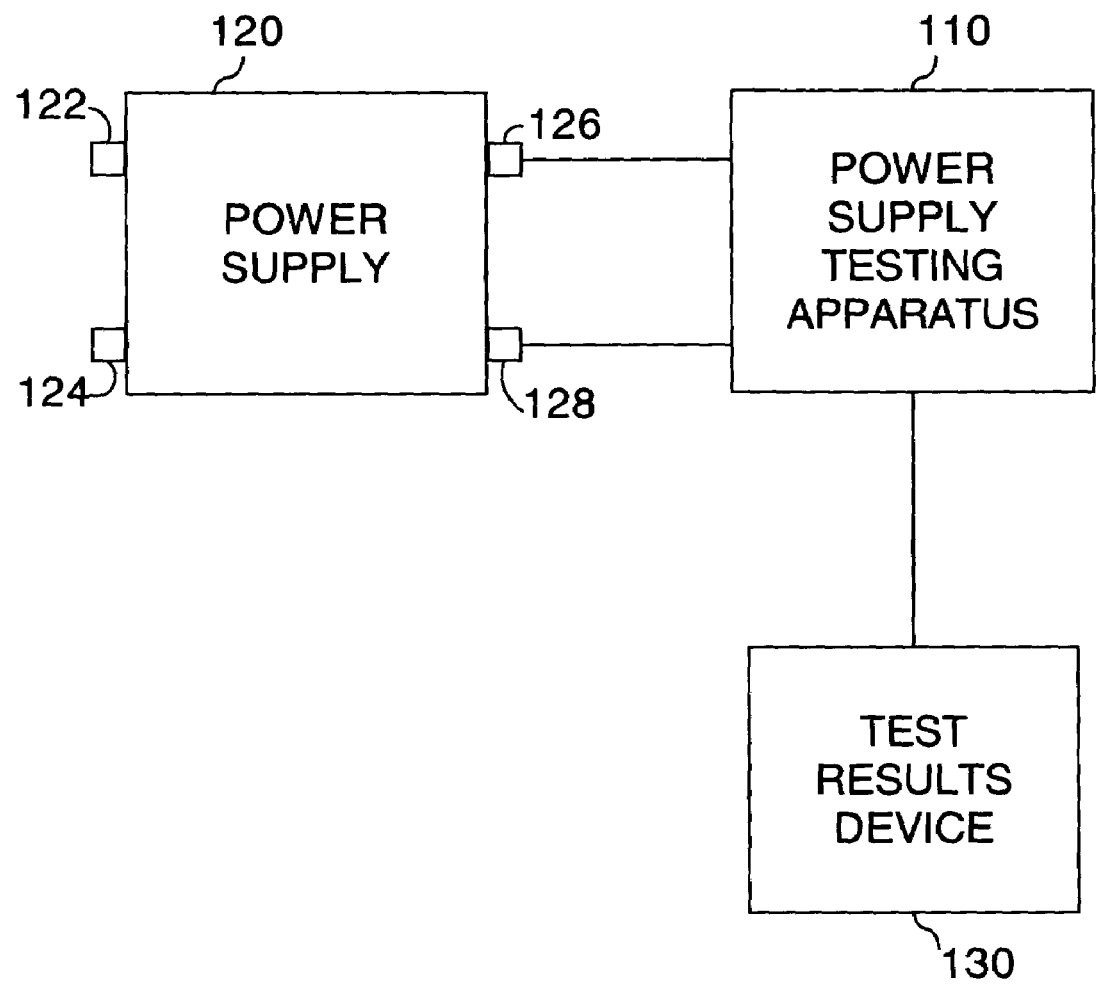
FIG. 1 depicts an apparatus for testing a power supply in accordance with an embodiment of the present invention.

Referring to FIG. 1, an apparatus for testing a power supply in accordance with an embodiment of the present invention is shown. Power supply testing apparatus 110 may be coupled to the output terminals 126, 128 of a power supply 120. Power supply 120 may be a DC/DC power supply which receives a DC input voltage at input terminals 122, 124. Power supply testing apparatus 110 may provide a dynamic load of a few one hundred milliamperes to several hundred amperes with an adjustable slew rate. Power supply testing apparatus 110 may be coupled to a test results device 130 for display of the testing results. In one embodiment of the invention, test results device may be an oscilloscope. Other types of test results devices may include a volt meter and current meter. It is contemplated that testing results may include peak voltage, low voltage, peak current, low current, time response, frequency response and the like.

Figure 2:
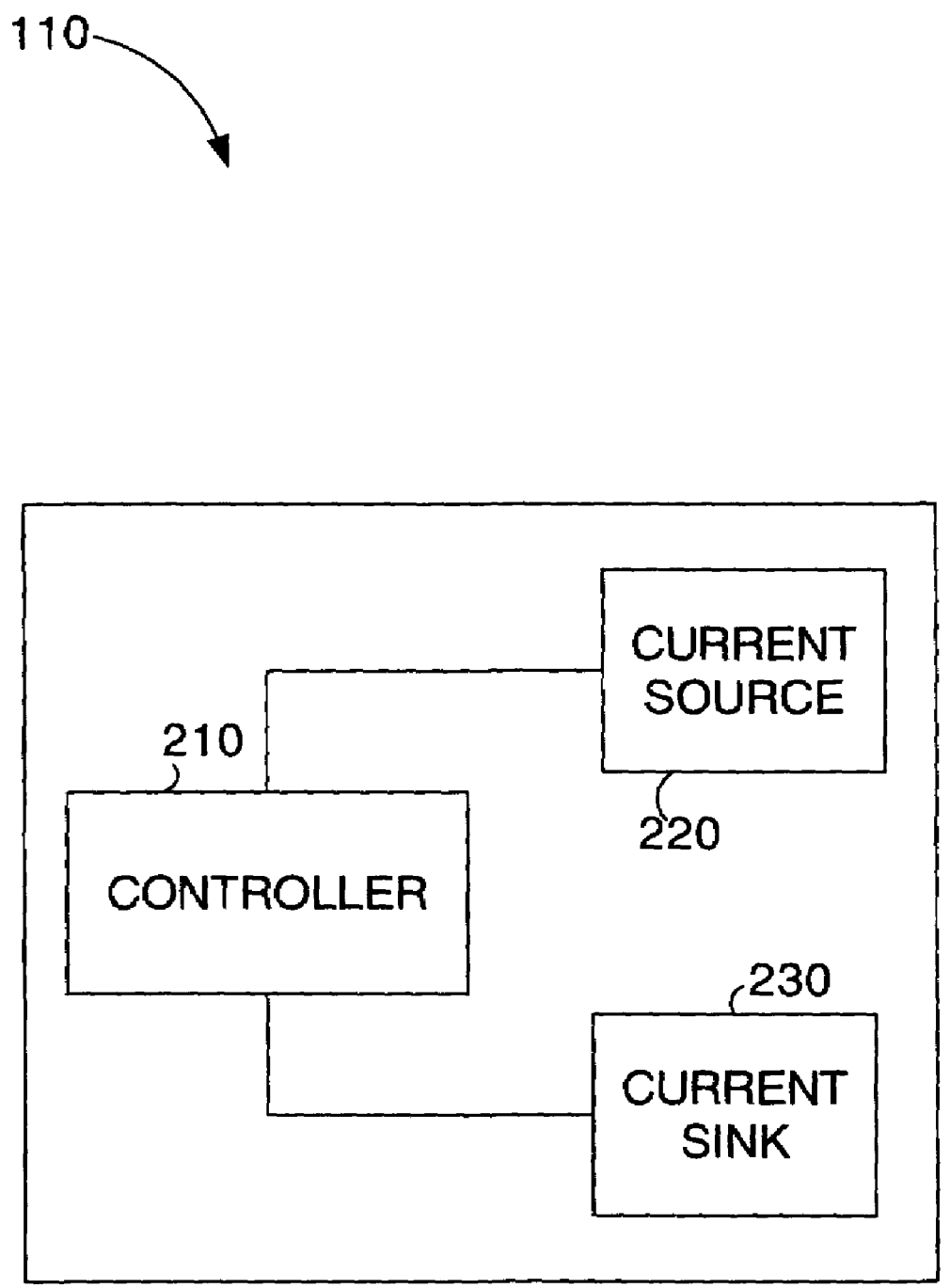
FIG. 2 depicts a block diagram of an apparatus for testing a power supply in accordance with an embodiment of the present invention.

Referring now to FIG. 2, a block diagram of an apparatus 110 for testing a power supply in accordance with an embodiment of the present invention is shown. Apparatus 110 may include a controller 210, a current source 220 and current sink 230. Controller 210 may operate to control testing of a power supply. In an embodiment of the invention, controller 210 may include a function generator. A function generator may refer to a piece of electronic equipment which may generate repetitive waveforms. The repetitive waveforms from the function generator may be converted into source and sink current by current source 220 and current sink 230 which may be injected into the output terminals of the power supply (as shown in FIG. 1). Waveforms may include a duty cycle of 10 to 90% and may be a frequency up to 1 MHz. It is contemplated that current source 220 may supply a current to the output terminals of a power supply where current sink 230 may receive current from the output terminals of a power supply. Current source 220 may supply a current of a few milliamperes to two hundred (200) amperes. Current sink 230 may receive a current from a few milliamperes to two hundred (200) amperes. While apparatus 110 is shown with a current source 220 and current sink 230, it is contemplated that apparatus 110 may include a controller 210 and current source 220 in one embodiment of the invention. In another embodiment of the invention, apparatus 110 may include a controller 210 and current sink 230 while omitting the current source 220 for testing of power supplies with reduced load dynamics.

Figure 3:
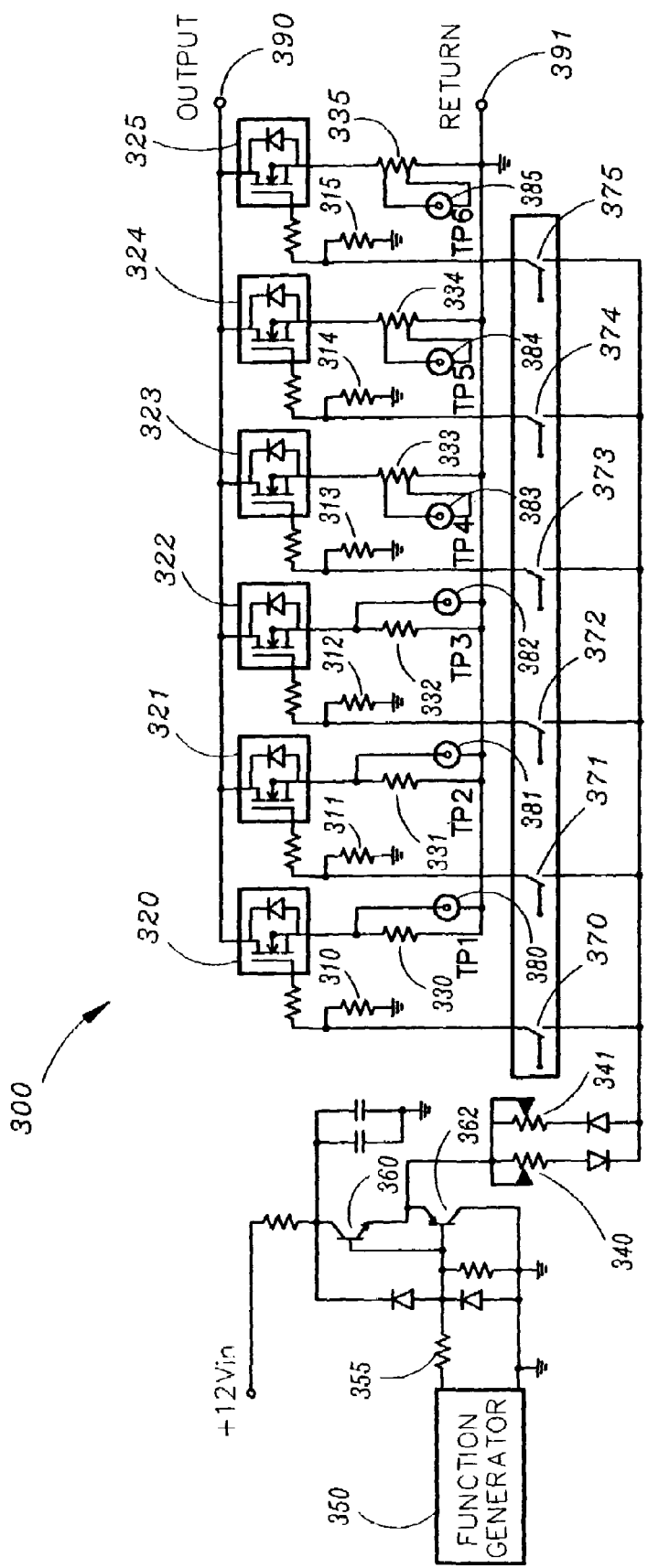
FIG. 3 depicts a schematic diagram of an apparatus for testing a power supply in accordance with an embodiment of the present invention.

Referring to FIG. 3, a schematic diagram of an apparatus 300 for testing a power supply in accordance with an embodiment of the present invention is shown. Apparatus 300 may be one exemplary implementation of apparatus 110 of FIG. 2. In an embodiment of the invention, apparatus 300 may not include a current source 220 of FIG. 2 providing a less complex implementation of apparatus 300.

Apparatus 300 may include current sink circuitry which may sink a variable amount of current, for example 0.3 to 200 amperes. Apparatus 300 may include a plurality of stages, six stages 310-315 according to one embodiment of the invention for sinking a varying amount of current, for example a few hundred milliamperes to two hundred (200) amperes. Each stage 310-315 may include a transistor 320-325 respectively. In one embodiment of the invention, transistors 320-325 may be field effect transistors (FETs). Transistors 320-325 may be emitter-follower buffer transistors. Each stage 310-315 may include a current setting resistor 330-335 of a different resistance value. Current setting resistor may have a resistance value to test a particular amount of current within each stage. The current sink range may be adjusted by switching one of switches 370-375 to control one of stages 310-315 and by varying the transistor gate drive voltage from an attached function generator 350 and switching emitter-follower buffer transistors 320-325 with different current setting resistors 330-335 in their sources. A function generator 350 may be coupled through resistor 355 to two emitter follower buffer transistors 360, 362. Function generator 350 may generate repetitive waveforms. The repetitive waveforms from the function generator 350 may be converted into sink current by stages 310-315 and injected into the output terminals of the power supply. Waveforms may include a duty cycle of 10 to 90% and may be a frequency up to 1 MHz. Slew rate may be adjusted through resistance variation of potentiometers 340, 341.

An output 390 of apparatus 300, provided through supply wires (not shown), may be provided from the common drains of the transistors 320-325 which may be connected to the output of a power supply on a motherboard, for example. The power supply may be connected to a return terminal 391 of apparatus 300, which may be coupled to a common ground of apparatus 300. In an embodiment of the invention, a variable sink current of 1.6 to 200 amperes was tested with a variable slew rate. In an embodiment of the invention, supply wires may be coupled to peak voltage and current supplied by the power supply tested with the apparatus 300 could be monitored to determine if the power supply was capable of handling such a dynamic load.

Testing of the power supply may be implemented by coupling leads of a test results device with a test point 380-385 and ground of the apparatus. It is contemplated that the test results device may be coupled with an associated test point of the stage which is being utilized to sink the selected amount of current. For example, in one embodiment of the invention, switch 370 could be closed to operate stage 310 and sink a small current of a few milliamperes. The leads of a test results device could be coupled to test point 380 and ground to test the load dynamics of a power supply. It is further contemplated that the slew rate may be adjusted through adjustment of a resistance of potentiometers 340, 341. In another example, switch 375 could be closed to operate stage 315 to sink a current of 200 amperes and test the load dynamics of the power supply with a current sink of 200 amperes. The leads of a test results device could be coupled to test point 385 and ground to test the load dynamics of a power supply. It is further contemplated that current of a value between a few milliamperes and 200 amperes could be tested by closing one of switches 371-374 to operate one of stages 311-314. It is further contemplated that each stage of apparatus 300 may be employed to test a power supply across a varying amount of current, whereby each stage is individually operated and tested. In alternative embodiments of the present invention, apparatus 300 may be implemented with various circuit components and configurations for sinking and sourcing a variable amount of current without departing from the scope and intent of the present invention.

Figure 4:
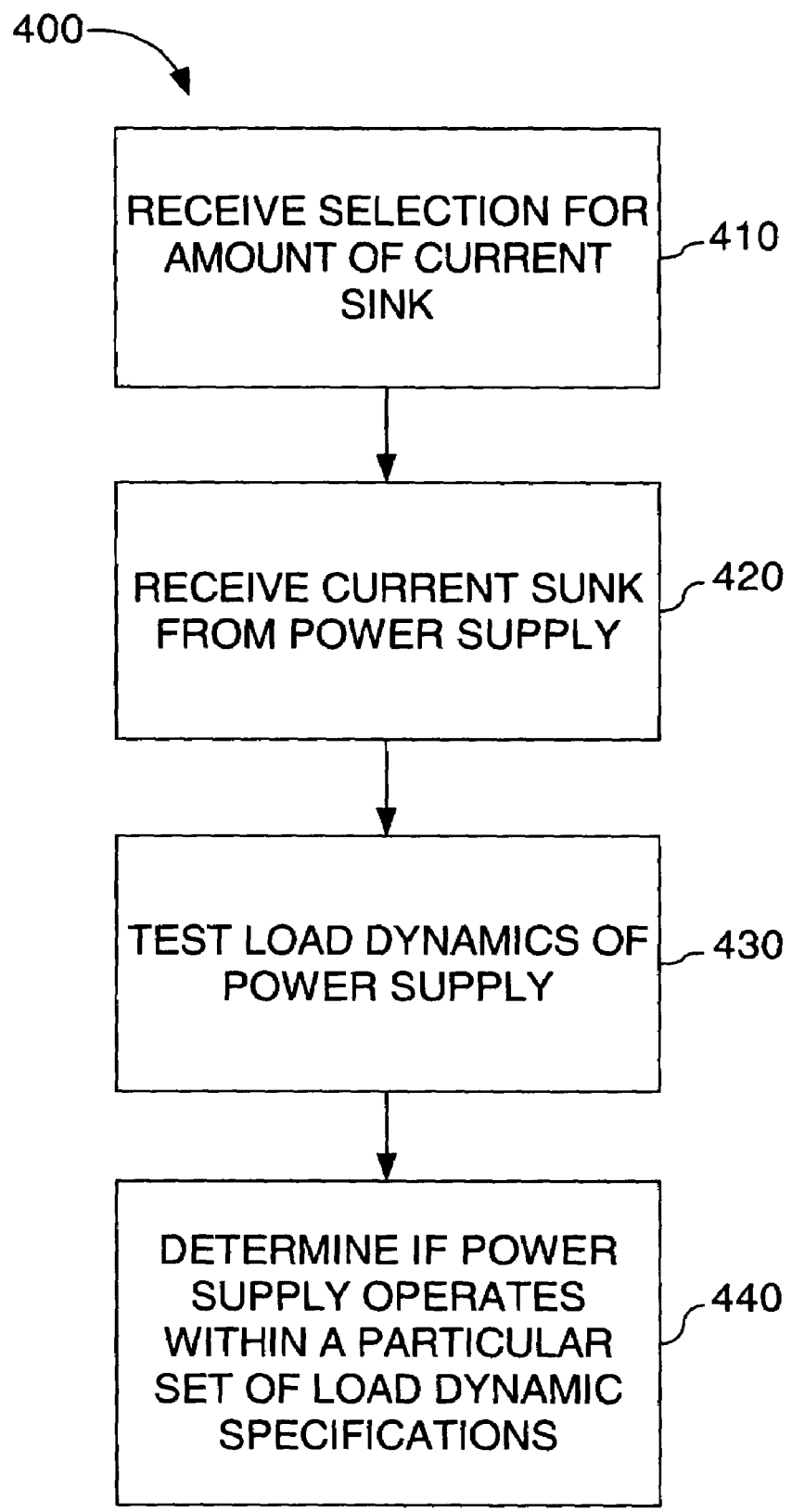
FIG. 4 depicts a method for testing a power supply in accordance with an embodiment of the present invention.

Referring to FIG. 4, a method 400 for testing a power supply in accordance with an embodiment of the present invention is shown. It is contemplated that method 300 for testing a power supply may be implemented with apparatus 300 for testing power supplies as described in FIG. 3. Method 400 may include receiving a selection for an amount of current sink 410. It is contemplated that receiving a selection for an amount of current sink may include the closing of a switch associated with a particular stage for sinking a particular amount of current as described in FIG. 3. Current may be sunk from a power supply 420 through a particular stage of the apparatus whereby the load dynamics of the power supply may be tested 430. It is further contemplated that method 400 may include an adjustment of a slew rate. Slew rate may be adjusted through adjustment of resistance of potentiometers 340, 341 of apparatus 300 of FIG. 3. It is contemplated that testing results may include peak voltage, low voltage, peak current, low current, time response, frequency response and the like whereby a power supply may be determined to be within a particular set of load dynamic specifications 440.

Figure 5:
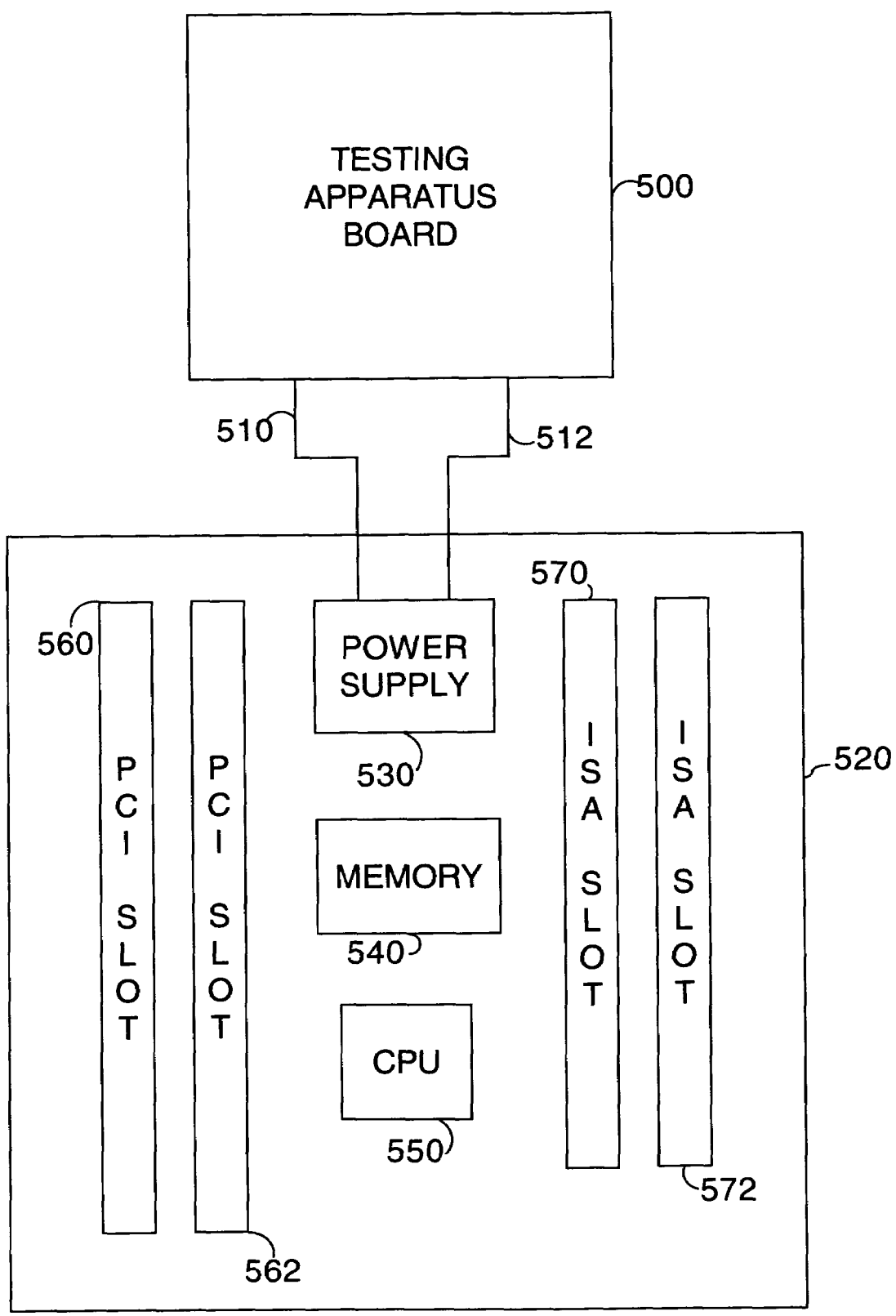
FIG. 5 depicts a testing apparatus board coupled to a circuit board power supply in accordance with an embodiment of the present invention.

Referring to FIG. 5, a testing apparatus board coupled to a soldered power supply module or embedded power supply module in accordance with an embodiment of the present invention is shown. Testing apparatus board 500 may include the components of apparatus 300 of FIG. 3 in one embodiment of the invention. Testing apparatus board 500 may be assembled in a low weight, small form factor implementation. For example, testing apparatus board may be implemented with a width of two inches, a length of three inches and a height of one inch. It is further contemplated that testing apparatus board may be implemented in a smaller form factor with dimensions less than a length of three inches, a width of two inches and a height of one inch, the overall form factor being limited only by the space required for integration of the circuit components on a board, chip and the like. A function generator may be coupled to the testing apparatus board 500 and since the testing apparatus board 500 may be assembled in a small form factor implementation, supply wires 510, 512 for coupling to a power supply under test may be short. Supply wires 510, 512 may also be referred as test wires. Supply wires 510, 512 may be varies types of low inductance supply wire, including cladded wire, ribbon cable and coaxial cable. It is contemplated that supply wires 510, 512 may be less than two inches. In an embodiment of the invention, an inner wire of coaxial cable may supply the load from apparatus board 500 and the return of the power supply 530 may be connected through the ground shield of the coaxial cable to the ground of the apparatus board 500. Such short length and use of coaxial cable substantially reduces the inductance to a value which allows injection of a high di/dt current pulses into the power supply 530 compared with supply wires of conventional power supply testers which create a substantial amount of inductance. For example, inductance of a typical two foot twisted pair wire employing #10 wire is at least 500 nanohenry (nH) where a two inch coaxial cable may have an inductance of less than 50 nH. The reduced inductance improves the external electronic load slew rate (di/dt) and enhances the quality of the power supply testing.

The testing apparatus board 500 with short supply wires 510, 512 allows testing of embedded power supplies and power supplies soldered to a main circuit board 520, such as a motherboard. A main circuit board 520 may include a power supply 530, memory 540, a processor such as a central processing unit (CPU) 550, PCI slots 560, 562 and ISA slots 570, 572. Power supply 530 may be a DC/DC power supply. When a power supply 530 is soldered in or embedded to a main circuit board 520, it is difficult to determine load percentage rating/dynamics of a power supply 530. Thus, for effective testing, the power supply 530 may be tested while the power supply 530 is coupled to the main circuit board 520 as allowed by the testing apparatus board 500 of the present invention.

It is believed that the system and method and system of the present invention and many of its attendant advantages will be understood by the forgoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof. It is the intention of the following claims to encompass and include such changes.

What is claimed is:

1. A power supply testing apparatus, comprising:
   a current source;
   a current sink; and
   a controller, said controller being coupled to said current source and current sink, wherein said power supply testing apparatus is configured for dynamic load testing of a load current between a first amperage value and a second amperage value, said controller controlling said current source and current sink for sourcing current and sinking current with variable slew rate, said slew rate being a change of current over a change of time, said slew rate being determined by adjustment of potentiometers, an amount of current being sourced or sunk being determined by operation of one or more stages wherein each stage comprises a transistor and a current setting resistor.

2. The power supply testing apparatus as claimed in claim 1, wherein said current source and current sink is housed on a circuit board.

3. The power supply testing apparatus as claimed in claim 1, further comprising supply wires for coupling to a power supply.

4. The power supply testing apparatus as claimed in claim 3, wherein said supply wires are a length of less than two inches.

5. The power supply testing apparatus as claimed in claim 1, wherein said controller includes a function generator.

6. The power supply testing apparatus as claimed in claim 5, wherein said function generator supplies a waveform to a power supply coupled to said power supply testing apparatus.

7. The power supply testing apparatus as claimed in claim 1, wherein each stage operates to at least one of source or sink a particular amount of current.

8. The power supply testing apparatus as claimed in claim 7, wherein a stage is selected to at least one of source or sink said particular amount of current by a switch associated with said stage.

9. A power supply testing apparatus, comprising:
   a controller,
   at least one potentiometer; and
   a current sink circuitry, said current sink circuitry including a plurality of stages for sinking a variable amount of current, each stage of said plurality of stages including a transistor and current setting resistor, wherein said power supply testing apparatus is configured for dynamic load testing of a load current between a first amperage value and a second amperage value, said controller controlling said current sink circuitry for sinking current with variable slew rate, said slew rate being a change of current over a change of time, said slew rate being determined by adjustment of said at least one potentiometer, an amount of current being sunk being determined by operation of one or more stages of said plurality of stages.

10. The power supply testing apparatus as claimed in claim 9, wherein said current sink circuitry is housed on a circuit board.

11. The power supply testing apparatus as claimed in claim 9, further comprising supply wires for coupling to a power supply.

12. The power supply testing apparatus as claimed in claim 11, wherein said supply wires are a length of less than two inches.

13. The power supply testing apparatus as claimed in claim 9, wherein said controller includes a function generator.

14. The power supply testing apparatus as claimed in claim 13, wherein said function generator supplies a waveform to a power supply coupled to said power supply testing apparatus.

15. The power supply testing apparatus as claimed in claim 9, wherein each stage operates to sink a particular amount of current.

16. The power supply testing apparatus as claimed in claim 15, wherein a stage is selected to sink said particular amount of current by a switch associated with said stage.

17. The power supply testing apparatus as claimed in claim 9, wherein said circuit board has a length of three inches.

18. The power supply testing apparatus as claimed in claim 17, wherein said circuit board has a width of two inches.

19. A power supply testing apparatus, comprising:
a controller,
at least one potentiometer;
a current sink circuitry, said current sink circuitry housed on a circuit board; and
at least one supply wire for coupling to a power supply;
said current sink circuitry including a plurality of stages for sinking a variable amount of current, each stage of said plurality of stages including a transistor and current setting resistor, wherein said power supply testing apparatus is configured for dynamic load testing of a load current between a first amperage value and a second amperage value, said controller controlling said current sink circuitry for sinking current with variable slew rate, said slew rate being a change of current over a change of time, said slew rate being determined by adjustment of said at least one potentiometer, an amount of current being sunk being determined by operation of one or more stages of said plurality of stages selectable by a switch associated with each stage, said at least one supply wire being coupled to a common drain of said plurality of stages of transistors.

20. The power supply testing apparatus as claimed in claim 19, wherein said at least one supply wire is a length of less than two inches.

21. The power supply testing apparatus as claimed in claim 19, wherein said controller includes a function generator.

22. The power supply testing apparatus as claimed in claim 21, wherein said function generator supplies a waveform to a power supply coupled to said power supply testing apparatus.

23. A method, executable by current sink circuitry, said current sink circuitry including a plurality of stages for sinking a variable amount of current, each stage of said plurality of stages including a transistor and current setting resistor, an amount of current being sunk being determined by operation of one or more stages of said plurality of stages, for testing a power supply, comprising:
receiving a selection of an amount of current sink for testing, said amount of current being between a first amperage value and a second amperage value;
receiving said amount of current sink drawn from said power supply;
varying said slew rate of said current, said slew rate being a change of current over a change of time;
testing load dynamics of said power supply during said change of current over said change in time; and
determining whether said power supply operates within a particular set of load dynamic specifications.

24. The method as claimed in claim 23, wherein said receiving said selection includes closing of a switch of a stage associated with said amount of current sink for testing.

25. The method as claimed in claim 23, wherein said slew rate is varied through adjustment of resistance of potentiometers of said current sink circuitry.

* * * * *